(12) United States Patent
Baumgartner et al.

(10) Patent No.: US 9,206,947 B2
(45) Date of Patent: Dec. 8, 2015

(54) LED MODULE, LED ILLUMINATION MEANS, AND LED LAMP FOR THE ENERGY-EFFICIENT REPRODUCTION OF WHITE LIGHT

(75) Inventors: Erwin Baumgartner, Graz (AT); Franz Schrank, Raaba (AT)

(73) Assignee: LUMITECH PRODUKTION UND ENTWICKLUNG GMBH, Jennersdorf (AT)

( * ) Notice: Subject to any disclaimer, the term of this patent is extended or adjusted under 35 U.S.C. 154(b) by 1669 days.

(21) Appl. No.: 12/723,487

(22) Filed: Mar. 12, 2010

(65) Prior Publication Data
US 2010/0237766 A1 Sep. 23, 2010

Related U.S. Application Data

(63) Continuation of application No. PCT/EP2008/007397, filed on Sep. 10, 2008.

(30) Foreign Application Priority Data

Sep. 12, 2007 (DE) .......... 10 2007 043 355

(51) Int. Cl.
| | | |
|---|---|---|
| H01J 1/62 | (2006.01) | |
| H01J 9/00 | (2006.01) | |
| F23Q 23/08 | (2006.01) | |
| F21K 99/00 | (2010.01) | |
| F21Y 101/02 | (2006.01) | |
| H01L 25/075 | (2006.01) | |
| H01L 33/50 | (2010.01) | |

(52) U.S. Cl.
CPC ........... *F21K 9/135* (2013.01); *F21Y 2101/02* (2013.01); *H01L 25/0753* (2013.01); *H01L 33/50* (2013.01); *H01L 2924/0002* (2013.01)

(58) Field of Classification Search
USPC ........... 257/57, 89, 13, 88, 81; 313/498, 503, 313/501, 45, 358, 46, 483, 485, 487; 359/238, 589, 590; 372/22; 445/24, 3
See application file for complete search history.

(56) References Cited

U.S. PATENT DOCUMENTS

| | | | |
|---|---|---|---|
| 5,813,753 | A | 9/1998 | Vriens et al. |
| 5,998,925 | A | 12/1999 | Shimizu et al. |
| 6,066,861 | A | 5/2000 | Höhn et al. |

(Continued)

FOREIGN PATENT DOCUMENTS

| | | |
|---|---|---|
| CN | 2924284 Y | 7/2007 |
| DE | 20104704 U1 | 7/2001 |

(Continued)

OTHER PUBLICATIONS

Search Report from German Patent and Trademark Office (Sep. 22, 2008, 4 pages).

(Continued)

*Primary Examiner* — Ashok Patel
(74) *Attorney, Agent, or Firm* — The Maxham Firm

(57) ABSTRACT

An LED module, selectively comprising at least zero, one, or a plurality of LEDs from Group B and/or Group G and/or Group R and at least one or more LEDs from Group P. The concentration of phosphors/phosphor mixtures of the LEDs in Group P is selected such that the photometric efficiency (lm/W) thereof is at or near the maximum as a function of the CIE x-coordinates.

15 Claims, 20 Drawing Sheets

BLUE AND RED LEDs UNDER A COMMON PHOSPHOR ELEMENT

(56) References Cited

U.S. PATENT DOCUMENTS

| | | |
|---|---|---|
| 6,212,213 B1 | 4/2001 | Weber et al. |
| 6,429,583 B1 | 8/2002 | Levinson et al. |
| 6,577,073 B2 | 6/2003 | Shimizu et al. |
| 6,686,691 B1 | 2/2004 | Mueller et al. |
| 6,809,347 B2 | 10/2004 | Tasch et al. |
| 6,817,735 B2 | 11/2004 | Shimizu et al. |
| 6,890,085 B2 | 5/2005 | Hacker |
| 6,943,380 B2 | 9/2005 | Ota et al. |
| 7,176,612 B2 | 2/2007 | Omoto et al. |
| 7,207,691 B2 | 4/2007 | Lee et al. |
| 2003/0067773 A1 | 4/2003 | Marshall et al. |
| 2004/0007961 A1 | 1/2004 | Srivastave et al. |
| 2004/0217364 A1 | 11/2004 | Tarsa et al. |
| 2005/0117334 A1 | 6/2005 | Lee et al. |
| 2005/0127381 A1 | 6/2005 | Vitta et al. |
| 2005/0161690 A1 | 7/2005 | Lai et al. |
| 2006/0138937 A1 | 6/2006 | Ibbetson |
| 2006/0152140 A1 | 7/2006 | Brandes |
| 2006/0243987 A1 | 11/2006 | Lai |
| 2007/0023762 A1 | 2/2007 | Gumins et al. |
| 2007/0223219 A1 | 9/2007 | Medendorp, Jr. et al. |
| 2007/0297179 A1 | 12/2007 | Leung et al. |
| 2008/0136313 A1 | 6/2008 | Van De Ven et al. |
| 2009/0296384 A1* | 12/2009 | Van De Ven et al. ......... 362/231 |
| 2010/0072919 A1 | 3/2010 | Wei et al. |
| 2010/0177509 A1* | 7/2010 | Pickard ......................... 362/184 |
| 2010/0237766 A1 | 9/2010 | Baumgartner et al. |

FOREIGN PATENT DOCUMENTS

| | | |
|---|---|---|
| DE | 10233050 A1 | 2/2004 |
| DE | 20317444 U1 | 2/2004 |
| DE | 10353293 A1 | 6/2005 |
| DE | 202006003878 U1 | 6/2006 |
| JP | 2004288760 A | 10/2004 |
| JP | 2005057089 | 3/2005 |
| JP | 2006080565 A | 3/2006 |
| JP | 2006179884 | 7/2006 |
| JP | 2007116112 | 5/2007 |
| JP | 2007122950 A | 5/2007 |
| JP | 2007134606 A | 5/2007 |
| JP | 2007227681 A | 9/2007 |
| KR | 100723912 B1 | 5/2007 |
| WO | 9750132 A1 | 12/1997 |
| WO | 0136864 A2 | 5/2001 |
| WO | 03019072 A1 | 3/2003 |
| WO | 2006062047 A1 | 6/2006 |
| WO | 2006105649 A1 | 10/2006 |
| WO | 2007075730 A2 | 7/2007 |
| WO | 2007123940 A2 | 11/2007 |
| WO | 2008053012 A1 | 5/2008 |
| WO | 2009033642 A1 | 3/2009 |

OTHER PUBLICATIONS

International Search Report (Feb. 19, 2009, 4 pages).
Mueller-Mach et al., "High-Power Phosphor-Converted Light-Emitting Diodes Based on III-Nitrides," IEEE Journal on Selected Topics in Quantum Electronics, Mar./Apr. 2002 (pp. 339-346),vol. 8, No. 2, IEEE.
Office Action from EPO, dated Oct. 4, 2010 (8 pages).
Japanese Office Action dated Jan. 29, 2013 for Japanese patent application No. 2010-524389, with English translation.
Power TOPLED, Enhanced Optical POER LED (ATON); OPTO Semiconductors (OSRAM) product data sheet (16 pgs.) (Nov. 30, 2005).
Japanese Decision of Rejection dated Sep. 17, 2013 for Japanese patent application No. 2010-524389, with English translation (5 pages).

* cited by examiner

PHOSPHOR OF DIFFERENT WAVELENGTHS

COLOR MIXTURE GROUP P AND GROUP R

CIRCUIT DIAGRAM WITH FOUR LEDs IN SERIES

3 LEDs OF GROUP P
1 LED OF GROUP R

CIRCUIT DIAGRAM WITH SIX LEDs THAT CAN BE REGULATED AND CONTROLLED SEPARATELY

CIRCUIT DIAGRAM WITH 18 LEDs THAT CAN BE REGULATED AND CONTROLLED SEPARATELY

12 LEDs OF GROUP P
4 LEDs OF GROUP R
2 LEDs OF GROUP B

LED LAMP WITH REFLECTOR WITH ONE OR MORE LED MODULES

LED MODULE, LED ILLUMINATION MEANS, AND LED LAMP FOR THE ENERGY-EFFICIENT REPRODUCTION OF WHITE LIGHT

FIELD OF THE INVENTION

This invention relates generally to lighting, and more particularly to an LED module and LED lamps having high efficiency and high color rendition.

DISCUSSION OF PRIOR ART

Various embodiments of EL lamps are known in which white light is generated based on LEDs. Essentially, two different embodiment types are known. In the first, the emission of three monochrome LEDs is additively mixed to form white. Usually the primary colors red, green and blue are used thereby, often referred to as RGB for short.

The second embodiment is based on the use of conversion luminophores, usually referred to as phosphors for short. Part of the primary emission of the LED (mostly blue in the wavelength range of approximately 460 nm) is thereby absorbed by the phosphor and emitted again as secondary radiation in a higher wavelength. The emission wavelength can vary thereby from 500 nm (green) to 630 nm (red). If a phosphor is used with emission of a complementary color (for blue, this is yellow), white emission can be realized additively. Solutions of this type are described in a large number of patents, for example, in WO 02/054502 A1 or DE 19638667 C2.

With the RGB embodiments, the disadvantages of EL lamps according to the prior art are the temperature-dependence of the emission color, because the individual LEDs have different temperature coefficients and also different behavior over the service life. This can be offset via a correspondingly complex control or regulation, as is described, for example, in DE 60021911 T2.

A further essential disadvantage of RGB solutions is the low color rendition. With the combination of the LEDs listed below in Table 1, an Ra8 value of 22 is achieved. The spectrum is shown in FIG. 1. The abscissa shows the wavelength in nm, the ordinate shows the intensity.

TABLE 1

| | RGB LEDs | | |
|---|---|---|---|
| Light color | x | y | Dominant Wavelength (nm) |
| Blue | 0.1442 | 0.0410 | 462.9 |
| Green | 0.1983 | 0.6966 | 529.7 |
| Red | 0.7000 | 0.2996 | 627.4 |

The color rendition can be increased through the addition of amber LEDs. With the combination of the LEDs listed in Table 2, an Ra8 value of 82 is achieved. The corresponding spectrum is shown in FIG. 2. However, the expenditure for control or regulation is increased through this additional LED.

TABLE 2

| | RGBA LEDs | | |
|---|---|---|---|
| Light color | x | y | Dom. wavelength (nm) |
| Blue | 0.1442 | 0.0410 | 462.9 |
| Green | 0.1983 | 0.6966 | 529.7 |
| Amber | 0.6010 | 0.3983 | 529.0 |
| Red | 0.7000 | 0.2996 | 627.4 |

In the "blue LED plus phosphor" embodiment, a division into two groups can be made—the group of LED solutions that emits cold light (for example, 6500K) or the group that emits warm light (for example, 3000K).

With embodiments with a color temperature of 6500K, the efficiency is high, but the solution has an inadequate color rendition of approximately Ra8=70-75. This embodiment can therefore be used for general lighting only to a limited extent.

An Ra8>90 can be achieved with an embodiment with a color temperature of 3000K. A major disadvantage of this solution is that the emission of the phosphor is carried out over a relatively broad wavelength range (large half width). The radiometric energy (radiant power) produced with phosphor is emitted in the wavelength range of 520 to 800 nm. The V(lambda) eye sensitivity curve evaluates this energy as only very low at wavelengths from 650 nm. Therefore energy is wasted unnecessarily.

These correlations are described in more detail based on figures and tables included therein.

In order to produce warm white light (2700-3500K), red phosphors must also be used. A corresponding 3000K spectrum is shown in FIG. 3. The abscissa of FIG. 3 shows the wavelength in nm—the ordinate shows the intensity normalized to 1. The V(lambda) luminosity sensitivity curve of the eye is likewise contained in FIG. 3.

The observation of the xx area range from 600 nanometers is important. This xx area range is produced between the descending curve branch of the V(lambda) curve and the spectrum.

In this range, the radiant power is rated very poorly by V(lambda). That is, a relatively large amount of energy is needed in order to produce little light. The reason for this is that the phosphors emit in a broad spectrum.

TABLE 3

10 nm steps - cumulative radiometric energy (radiant power) in % and associated cumulative lumens in %

| min. nm | max. nm | 3000 K- mW | 3000 K- lm |
|---|---|---|---|
| 380 | 389 | 0.01% | 0.00% |
| 390 | 399 | 0.02% | 0.00% |
| 400 | 409 | 0.03% | 0.00% |
| 410 | 419 | 0.04% | 0.00% |
| 420 | 429 | 0.08% | 0.00% |
| 430 | 439 | 0.28% | 0.01% |
| 440 | 449 | 1.48% | 0.09% |
| 450 | 459 | 4.59% | 0.43% |
| 460 | 469 | 7.19% | 0.86% |
| 470 | 479 | 8.97% | 1.30% |
| 480 | 489 | 10.23% | 1.78% |
| 490 | 499 | 11.49% | 2.52% |
| 500 | 509 | 13.13% | 4.02% |
| 510 | 519 | 15.42% | 7.11% |
| 520 | 529 | 18.34% | 12.23% |
| 530 | 539 | 21.79% | 19.23% |
| 540 | 549 | 25.67% | 27.71% |
| 550 | 559 | 29.98% | 37.36% |
| 560 | 569 | 34.73% | 47.77% |
| 570 | 579 | 39.90% | 58.38% |

TABLE 3-continued 10 nm steps - cumulative radiometric energy (radiant power) in % and associated cumulative lumens in %

| min. nm | max. nm | 3000 K-mW | 3000 K-lm |
|---|---|---|---|
| 580 | 589 | 45.42% | 68.53% |
| 590 | 599 | 51.16% | 77.55% |
| 600 | 609 | 56.93% | 84.98% |
| 610 | 619 | 62.56% | 90.65% |
| 620 | 629 | 67.91% | 94.61% |
| 630 | 639 | 72.84% | 97.10% |
| 640 | 649 | 77.31% | 98.56% |
| 650 | 659 | 81.27% | 99.33% |
| 660 | 669 | 84.71% | 99.70% |
| 670 | 679 | 87.69% | 99.87% |
| 680 | 689 | 90.23% | 99.95% |
| 690 | 699 | 92.37% | 99.98% |
| 700 | 709 | 94.16% | 99.99% |
| 710 | 719 | 95.64% | 100.00% |
| 720 | 729 | 96.87% | 100.00% |
| 730 | 739 | 97.89% | 100.00% |
| 740 | 749 | 98.72% | 100.00% |
| 750 | 759 | 99.40% | 100.00% |
| 760 | 769 | 99.96% | 100.00% |
| 770 | 779 | 100.00% | 100.00% |

99% of the luminous flux is produced with 80% of the radiometric energy (radiant power). 20% of the radiometric energy (from approx. 650 nm) produces only 1% of the luminous flux. FIG. 4 shows this correlation graphically. The abscissa of FIG. 4 represents the wavelength in nm and the ordinate represents the cumulative radiant power or the cumulative luminous flux in %.

Due to the broad emission of the red phosphors and the lower efficiency of the red phosphors (FIG. 8), all of the phosphor conversion solutions produce radiant power that is poorly evaluated by V(lambda). 20% of the radiant power is required in order to produce 1% of the light.

In addition to the two embodiments described above, mixed forms are also known. DE 10353293 A1 is cited here by way of example, in which a monochromatic red LED can be manually added to a white emitting LED (with phosphor) when necessary. An underwater lamp is thus realized, wherein the user of the lamp can offset different operating ranges of individual spectral colors caused by a wavelength-dependent absorption in certain ranges.

In DE 10216394 B3 a construction is described, in which, in addition to the white LEDs (blue plus phosphor), the four colors, cyan, green, yellow, and red, are also used. A very good color rendition is thus achieved, but with no improvement in efficiency.

The combination of a white LED with yellow is described in DE 20104704 U1. The essential feature is that the blue portion is to be compensated with yellow. Obviously, a cold white with a high blue portion is used, which does not permit the realization of an LED lighting means with high efficiency.

DE 202006003878 U1 describes lamps for bioreactors, wherein for phototropic cell cultures, that wavelength range is to be used if possible in which the cell culture thrives best. The individual spectral ranges can also be controlled individually.

In DE 20317444 U1 a street lamp is described wherein the main portion in the spectral emission lies in the green range, but red, amber, blue, and white are also used.

Insufficient color rendition, inefficient utilization of the radiometric energy (radiant power) and technically complex construction must be cited as disadvantages according to the prior art.

Summary of Embodiments of the Invention

A purpose of the present invention is to provide an LED module for LED lighting means and LED lamps which has the highest possible efficiency and high color rendition and does not thereby exhibit the disadvantages of existing solutions. The LED module according to embodiments of the invention combines the advantages of the phosphor-based LED solutions with the advantages of the RGB solutions.

BRIEF DESCRIPTION OF THE DRAWING

The invention is further described below by means of the subsequent detailed description of advantageous embodiment examples of the invention, reference being made to accompanying drawing, wherein.

DETAILED DESCRIPTION OF EMBODIMENTS OF THE INVENTION

Definitions

CIE 1931

Figure 5:
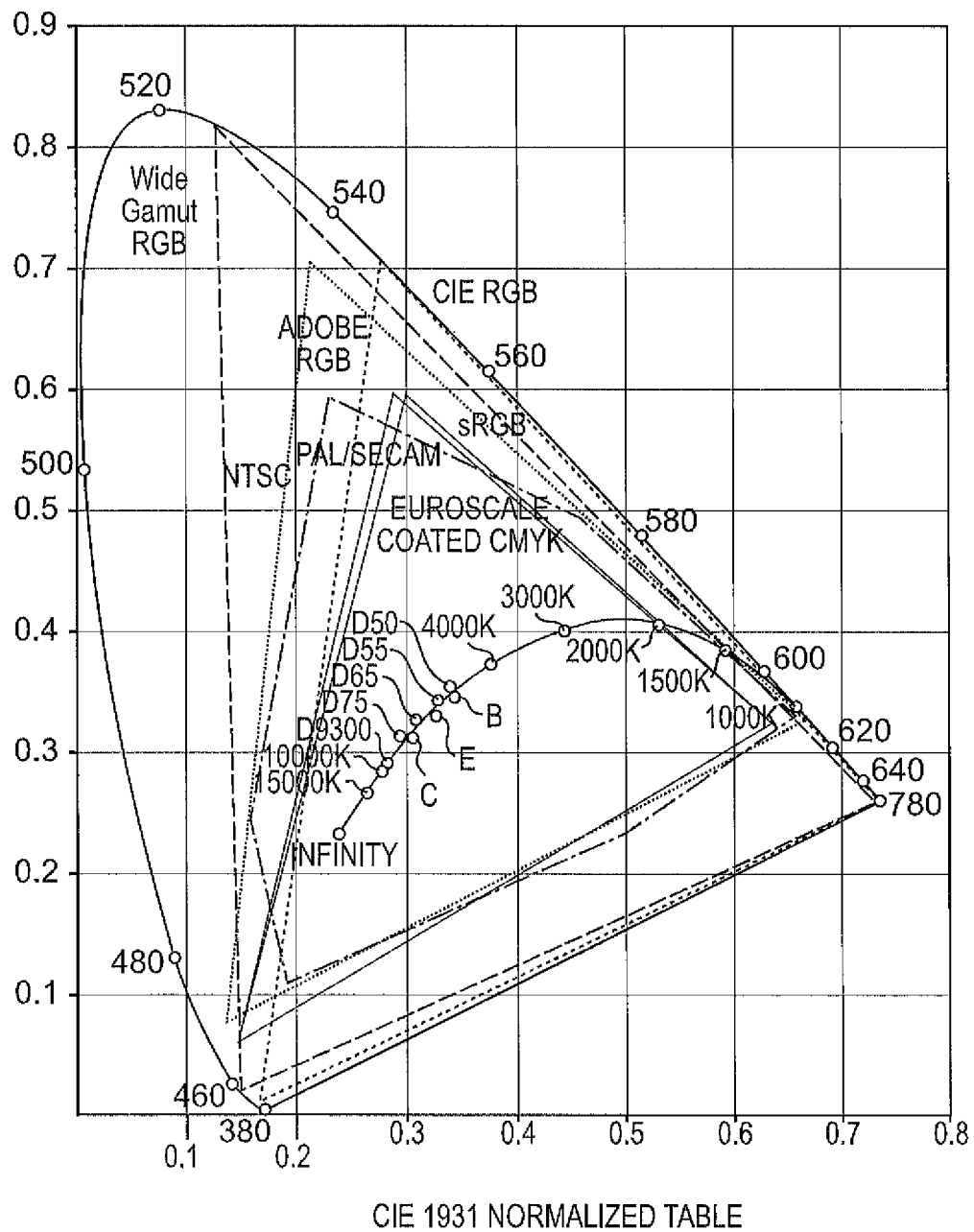
FIG. 5 is a CIE 1931 chromaticity table.

The CIE Standard Colorimetric System or CIE Chromaticity System is the definition of the International Commission on Illumination (CIE—Commission internationale de l'eclairage), to represent colors based on the human color perception apparatus. This representation makes it possible to represent a color locus with two coordinates. FIG. 5 shows the CIE 1931 diagram. The abscissa represents the x value of the CIE 1931 diagram and the ordinate represents the y value of the CIE 1931 diagram.

In the CIE chromaticity table, the horseshoe-shaped range of possible colors is plotted on a coordinate system, on which x and y portion (the CIE normalized theoretical primary colors X, Y, and Z (also referred to as the CIE XYZ color space) of any color A, B, C, E, can be read off directly. Through the basic condition x+y+z=1, the z portion can be respectively determined by calculation (z=1−x−y). All possible colors are covered by the spectral color line (spectrally pure colors) as well as the purple line.

The central reference point of the table is the white point A (approximately 3000K), essential in every color measurement situation. Depending on the lighting situation, this can be located virtually everywhere inside the horseshoe. However, only the black body curve is technically important, in the course of which the colors A, B, C, D, E are given in Kelvin as the temperature of an ideal emitter (black body). Beyond the color space used, the spectral color corresponding to the specific situation can be read off on the spectral color line. On the exactly opposite side of A, B, C, D, E, the complementary colors can be read off an extended line. The point thereby represents the most extreme (purest) complementary color, which in this case is defined by the intersection with the purple line.

The points A, B, C, D, E given in FIG. 5 relate to the following explanation: Originally, the CIE Standard Colorimetric System was developed above all with regard to illumination questions. The system, in principle, permits every conceivable combination of X, Y, and Z values. For the sake of simplicity and comparability, however, certain standard colors of the spectrum were defined, all of which are located more or less on the black body curve, and correspond to a certain color temperature.

TABLE 3A

Standard illuminants according to CIE

| CIE standard illuminant | x value | y value | Note |
| --- | --- | --- | --- |
| CIE standard illuminant A | 0.4476 | 0.4074 | Light spectrum similar to an incandescent bulb |
| CIE standard illuminant B | 0.3484 | 0.3516 | — |
| CIE standard illuminant C | 0.3101 | 0.3162 | White point of the NTSC TV standard |
| CIE standard illuminant E | ⅓ | ⅓ | White point of the CIE RGB color space; X, Y, and Z in exactly equal proportions |
| D5000 or D50 | 0.3457 | 0.3585 | White point for wide gamut RGB and color match RGB |
| D5500 or D55 | 0.3324 | 0.3474 | Light spectrum similar to that of average daylight, spectrum similar to a black body at 5500 Kelvin |
| D6500 or D65 | 0.312713 | 0.329016 | White point for sRGB, adobe RGB, and the PAL/SECAM TV standard, spectrum similar to a black body at 6504 Kelvin |
| D7500 or D75 | 0.2990 | 0.3149 | Spectrum similar to a black body at 7500 Kelvin |
| D9300 | 0.2848 | 0.2932 | Spectrum similar to a black body at 9300 Kelvin |

Standard Color Temperatures:

Standardized colors with the following color temperatures can be shown with x, y coordinates as follows:

TABLE 4

CIE 1931 coordinates of standard color temperatures

| Color | x CIE 1931 | y CIE 1931 |
| --- | --- | --- |
| 6500 K | 0.313 | 0.337 |
| 5000 K | 0.346 | 0.359 |
| 4000 K | 0.380 | 0.380 |
| 3500 K | 0.409 | 0.394 |
| 3000 K | 0.440 | 0.403 |
| 2700 K | 0.463 | 0.420 |

Phosphors

These are understood to be generally luminescent materials that absorb the radiation of a specific wavelength and emit radiation in another wavelength. The emitted radiation generally has a larger wavelength. The excitation of the phosphor thereby occurs in the UV range or also in the visible range. Available phosphors are usually excited in wide wavelength ranges, and these are referred to as excitation spectra. Also the emission does not occur at one wavelength but over a certain wavelength range. Thus several characteristic values are always given to characterize phosphors, such as peak wave length, dominant wavelength, half width (range in nm at an intensity of 50% of the maximum), or color locus in the CIE (1931) color space. The emission wavelength determines the color of the emitted light. The quantum yield reveals which portions of the absorbed radiation are emitted again.

Of primary interest is to produce white light with LEDs which absorb a primary radiation with a dominant wavelength of approximately 460 nm and emit light in a wavelength range of 500 to 630 nm peak wavelength. Solutions of this type are described in a large number of patents, by way of example are patents WO 02/054502 A1 or DE 19638667 C2 already cited above.

Phosphors are shown by way of example in Table 5.

TABLE 5

Peak wavelengths and CIE 1931 coordinates of phosphors

| Phosphor name | Peak wavelength [nm] | CIE 1931 x | CIE 1931 y |
|---|---|---|---|
| P-535 | 533 | 0.342 | 0.608 |
| P-565 | 564 | 0.448 | 0.538 |
| P-610 | 610 | 0.568 | 0.430 |
| P-YAG | 559 | 0.451 | 0.531 |

The above-referenced phosphors are standard types that are commercially available in production quantities. The peak wavelength and the color locus in the CIE color space are essential for favorable use.

Figure 6:
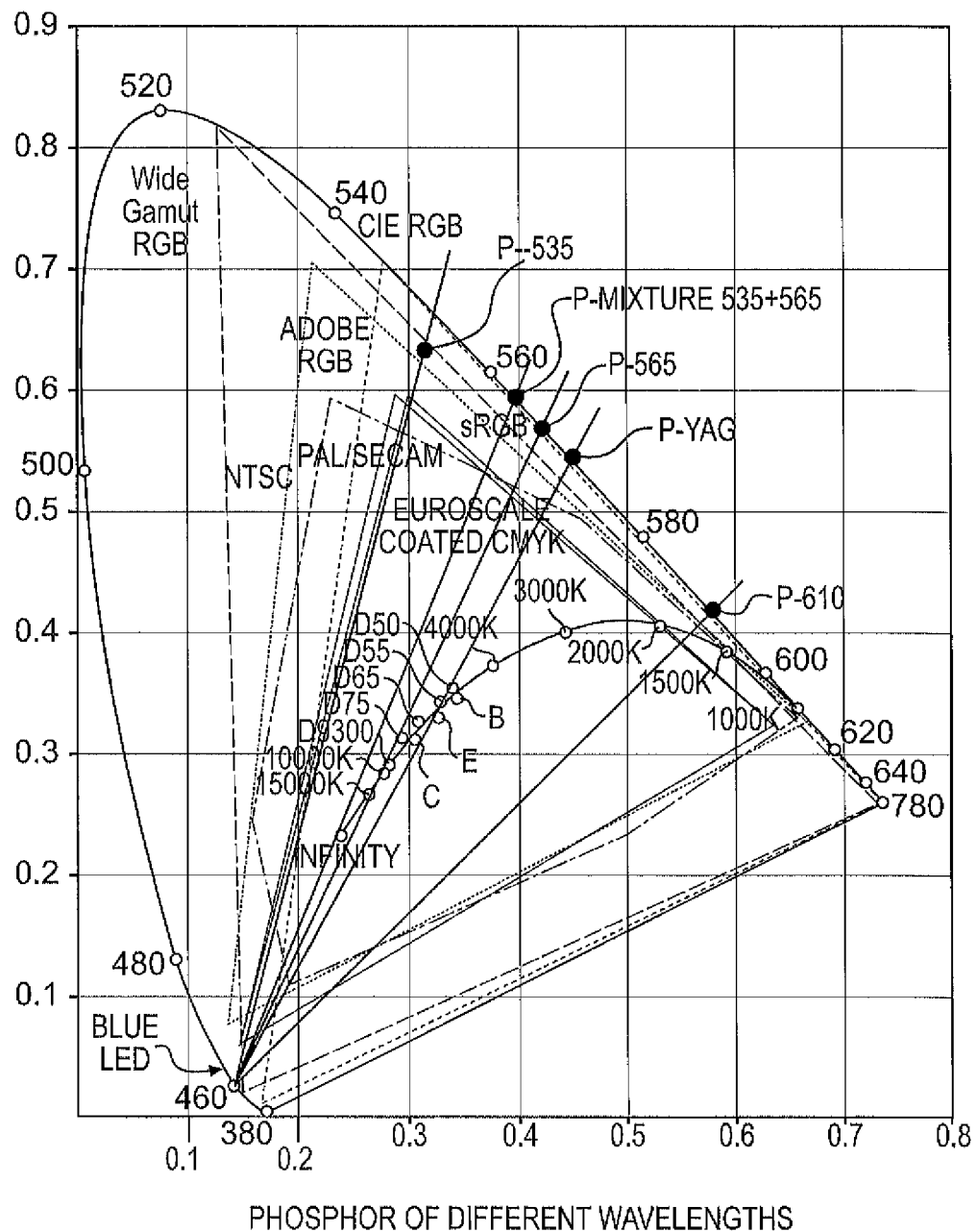
FIG. 6 shows emission of phosphors of different peak wavelength, shown in the CIE 1931 color space.

FIG. 6 shows by way of example the color mixture of blue LEDs with phosphors. The abscissa of FIG. 6 shows the x coordinate, and the ordinate shows the y coordinate of the CIE 1931 diagram. Depending on the concentration of a phosphor, or the mixture of phosphors, each point on the line between the blue LED and the phosphor (or the mixture) can be adjusted.

Efficiency

In addition to the processes of absorption and emission described above, light scattering and reflectance also occur in the use of phosphors. These two processes lead to a reduction of the light yield.

When phosphor elements with increasing concentration of the phosphor are arranged via an LED with dominant wavelength of approximately 460 nm, it can be shown immediately by measurements of the radiant power (in watts) that the losses increase with the concentration of the phosphor.

Figure 7:
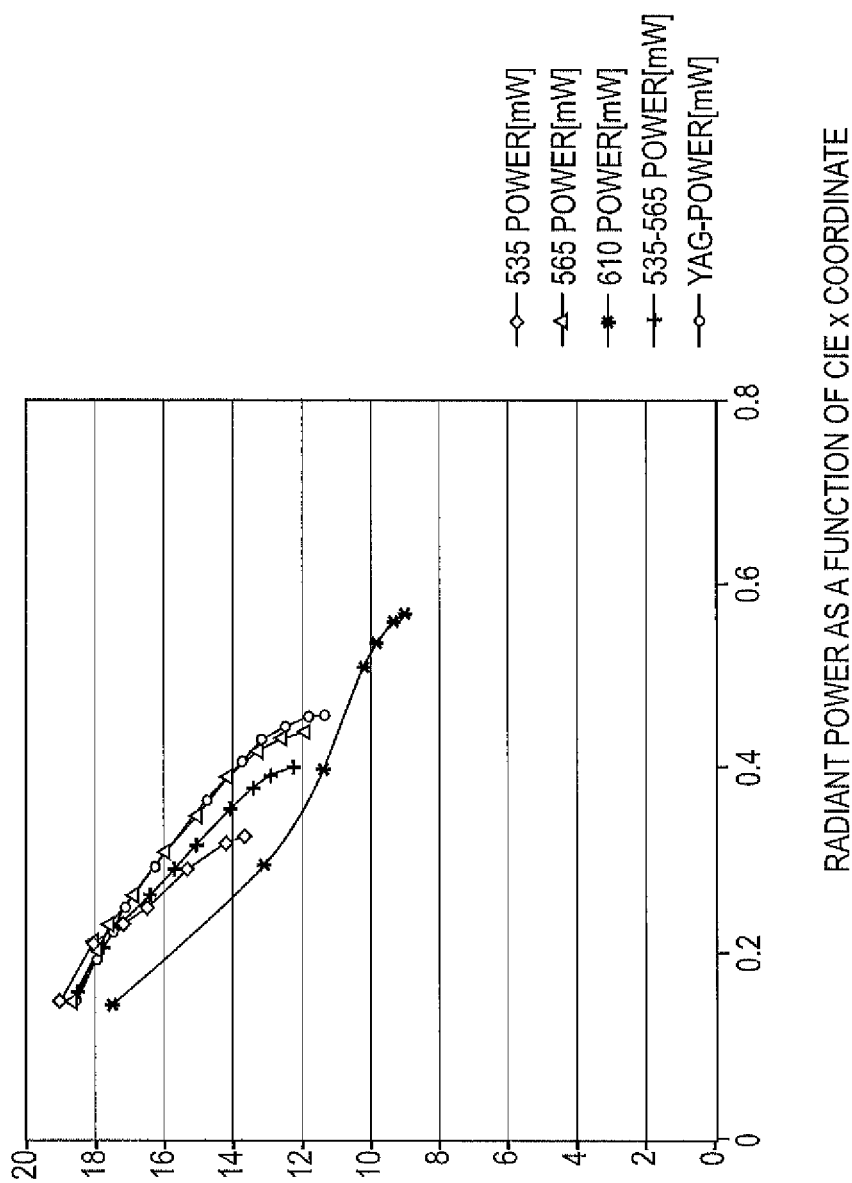
FIG. 7 shows the decrease in the radiant power with increasing concentration of the phosphors in the CIE 1931 coordinates.

FIG. 7 clarifies this correlation. The abscissa of FIG. 7 represents the x-coordinate of the CIE 1931 diagram and the ordinate represents the radiant power in mW. It is clear here that the radiant power decreases markedly with increasing concentration of the phosphor. This correlation applies to all of the phosphors currently known and accessible for measurement.

Figure 8:
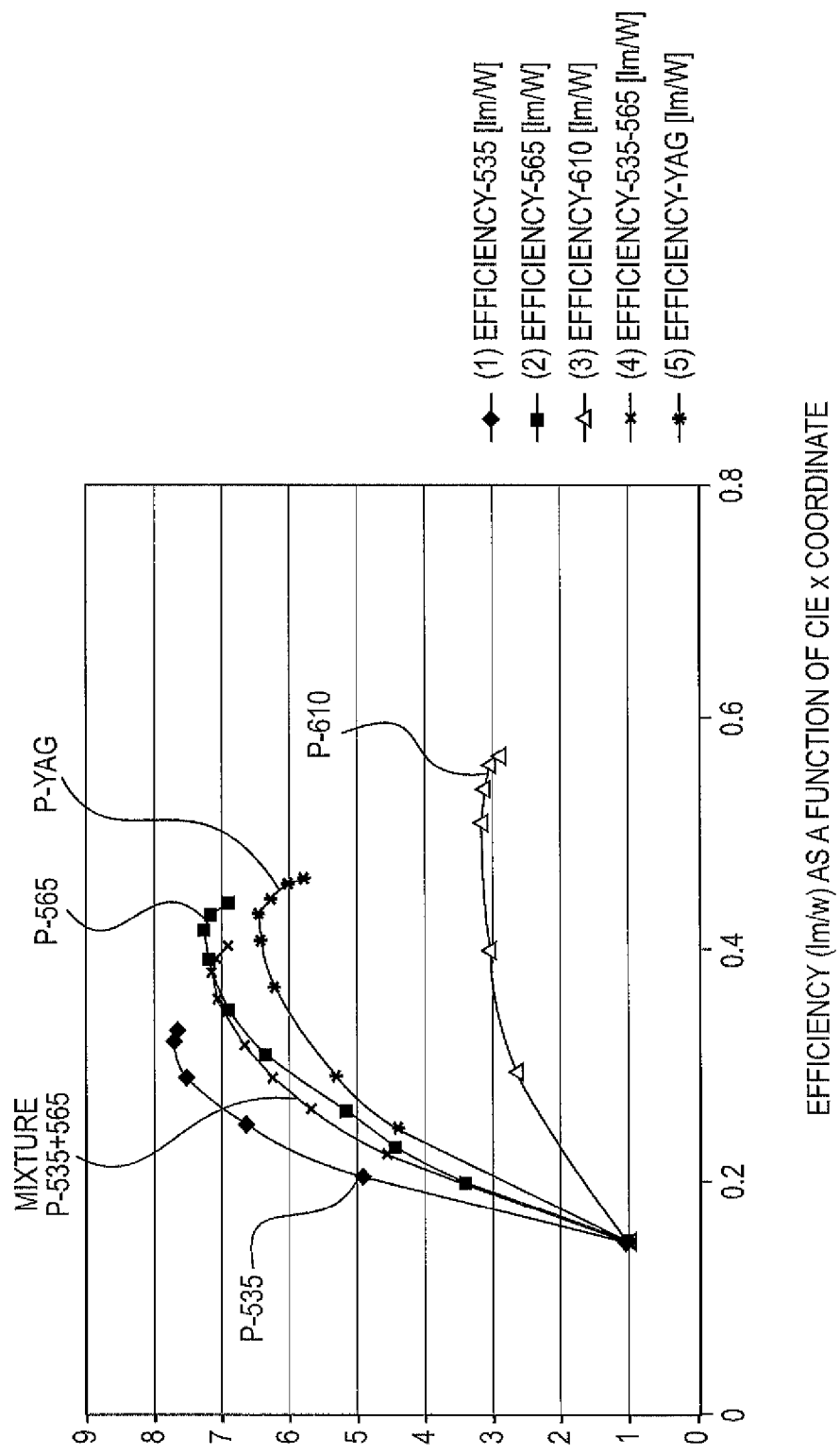
FIG. 8 is a graph of the efficiency of the phosphors in lumens per watt as a function of the concentration (shown the ascending x-axis of the CIE 1931 coordinates) where the values are normalized to the blue LED (=1) to make comparison easier.

For the application as a light source, however, a weighting corresponding to eye sensitivity (V-lambda) is necessary. If this weighting is carried out, and now the light intensity (in lumens) is observed as a function of the phosphor concentration, first the intensity increases, passes through a maximum and then decreases again. That is, the losses dominate from a certain quantity of phosphor. FIG. 8 clarifies this correlation. The abscissa of FIG. 8 represents the x coordinate of the CIE 1931 diagram and the ordinate represents the efficiency (lm/W) normalized to the blue LED.

This means for the efficiency of the light source that a maximum of efficiency, given in lumens/watt, exists for each phosphor type used. FIG. 8 shows that phosphor P-535 has the maximum efficiency x approximately 0.31 with CIE 1931 x coordinate.

FIG. 8 likewise shows that phosphor P-565 has the maximum efficiency x approximately 0.41 with CIE 1931 x coordinate. FIG. 8 further shows that phosphor P-610 has the maximum efficiency with CIE 1931 x coordinate over a value range of x approximately 0.39 to x approximately 0.56. Furthermore, FIG. 8 shows that phosphors have different efficiency maximums. Phosphor P-535 is more efficient than phosphor P-565.

Embodiments of the invention utilize the finding of operating an LED lighting means only such that the phosphor emitting the radiation is operated respectively in its efficiency maximum (or in a range around the maximum).

Although it is preferred to carry out the operation in the maximum itself, embodiments of the invention also cover a mode of operation in a range of up to minus 20% of the maximum of the respective phosphor or the phosphor mixtures. Thus a color value is adjusted that corresponds to this maximum or is near thereto.

Group B

Group B is a light-emitting diode or several light emitting diodes with a dominant wavelength in the value range between 380 nm-480 nm. Likewise, Group B can be formed by several light-emitting diodes with different dominant wavelengths in the value range between 380 nm-480 nm.

Group G

Group G is a light-emitting diode or several light-emitting diodes with a dominant wavelength in the value range between 500-560 nm. Likewise, Group G can be formed by several light-emitting diodes with different dominant wavelengths in the value range between 500-560 nm.

Group R

Group R is a light-emitting diode or several light-emitting diodes with a dominant wavelength in the value range between 600 nm-640 nm. Likewise, Group R can be formed by several light-emitting diodes with different dominant wavelengths in the value range between 600-640 nm.

Group P

Group P is a light-emitting diode or several light-emitting diodes, wherein light-emitting diodes of group B excite phosphors. The concentration of the phosphors/phosphor mixtures is selected such that the photometric efficiency (lm/W) lies at the maximum or near to the maximum.

Embodiments of the Invention

The solution approach according to the invention uses the efficiency of the phosphors (Group P) achieved in the range of the maximum of the efficiency (lm/W) in order to produce white light therefrom.

Figure 9:
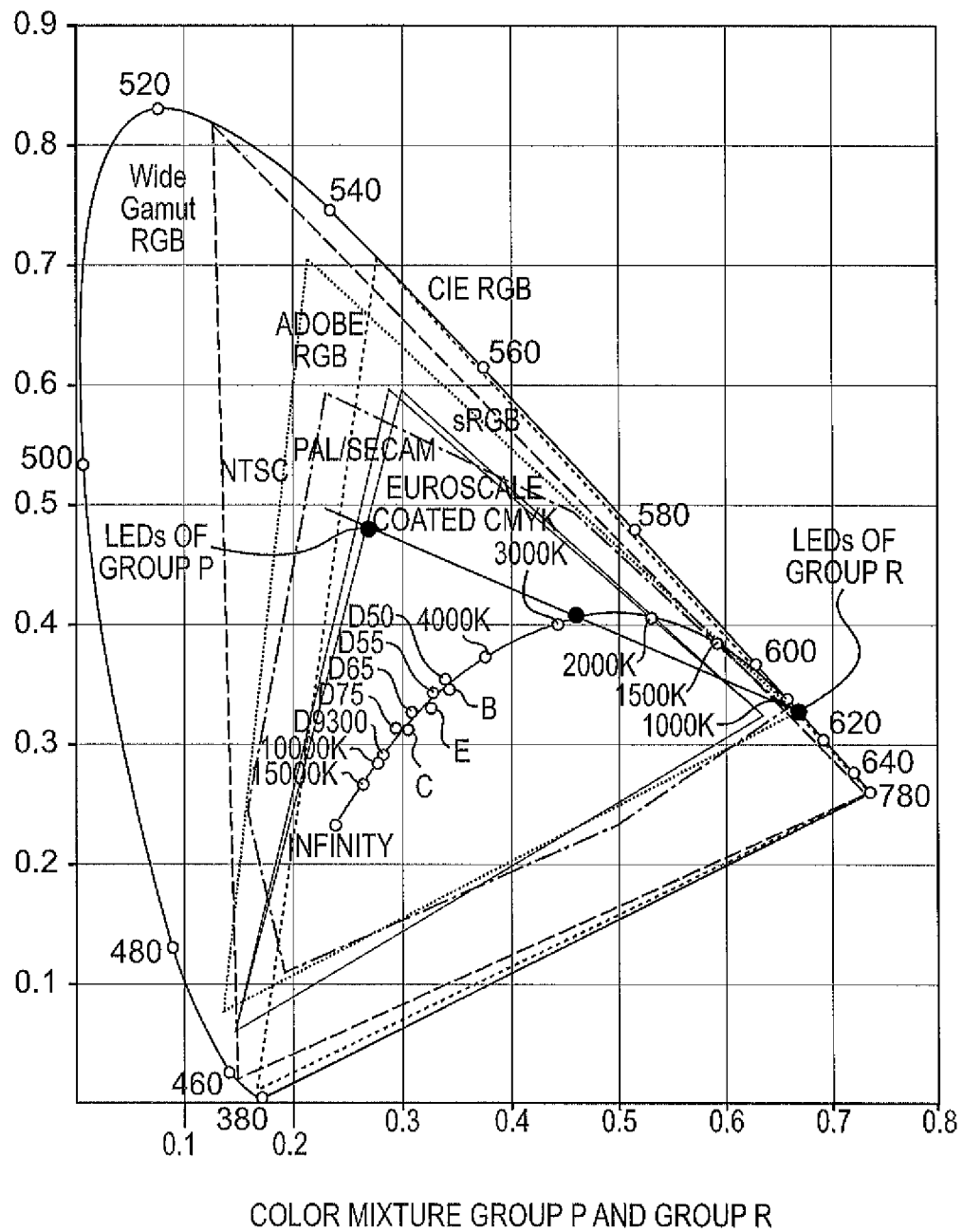
FIG. 9 is an example of a color mixture of LEDs of Group P and of LEDs of Group R in the CIE 1931 color space.
Figure 10:
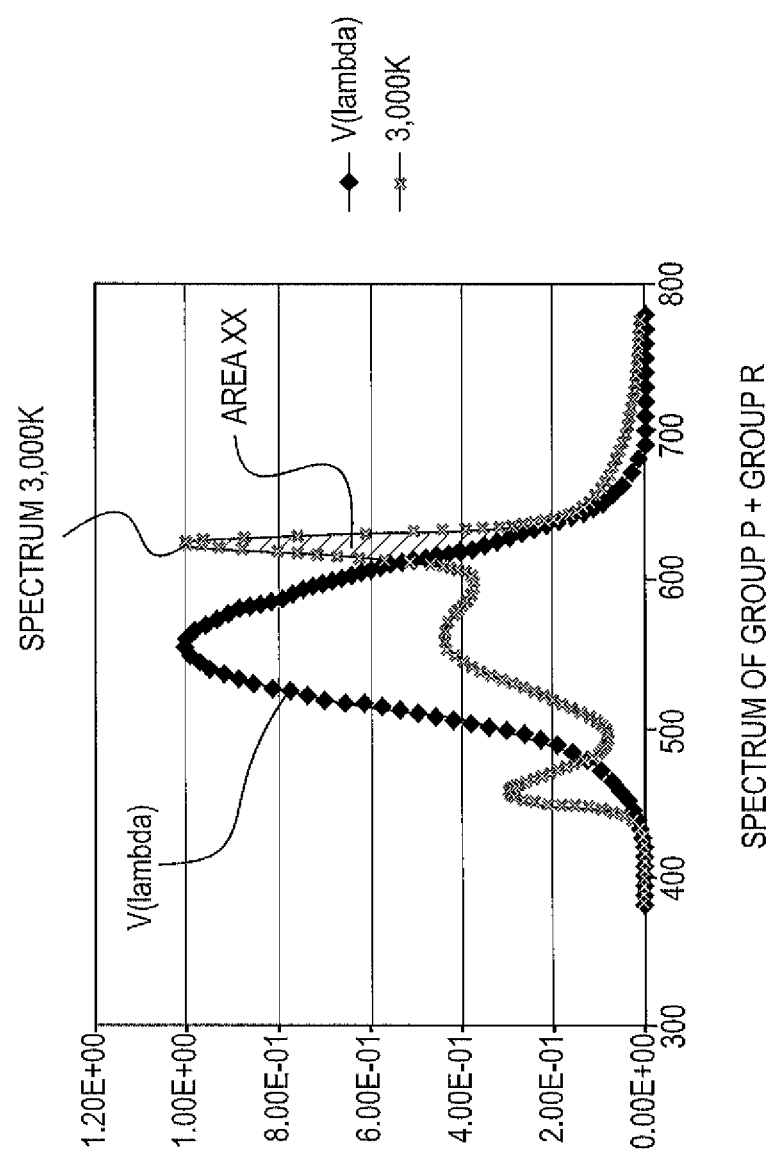
FIG. 10 is a graph of an example of a color mixture of LEDs of Group P and of LEDs of Group R shown as a spectrum, where the V(lambda) luminosity sensitivity curve is also plotted.

FIG. 9 shows this color mixture in the CIE 1931. Here warm white light of the color temperature 3000K is produced by color mixture by LEDs of Group P and Group R. The spectrum of the color mixture is shown in FIG. 10. The abscissa of FIG. 10 represents the wavelength in nm and the ordinate represents the intensity in mW. Furthermore, the V(lambda) curve is shown in FIG. 10. This mixture of LEDs of Group P with LEDs of Group R represents an optimal energy balance between radiant power and photometric efficiency (lm/W). The Ra8 color rendition is 91.

Figure 1:
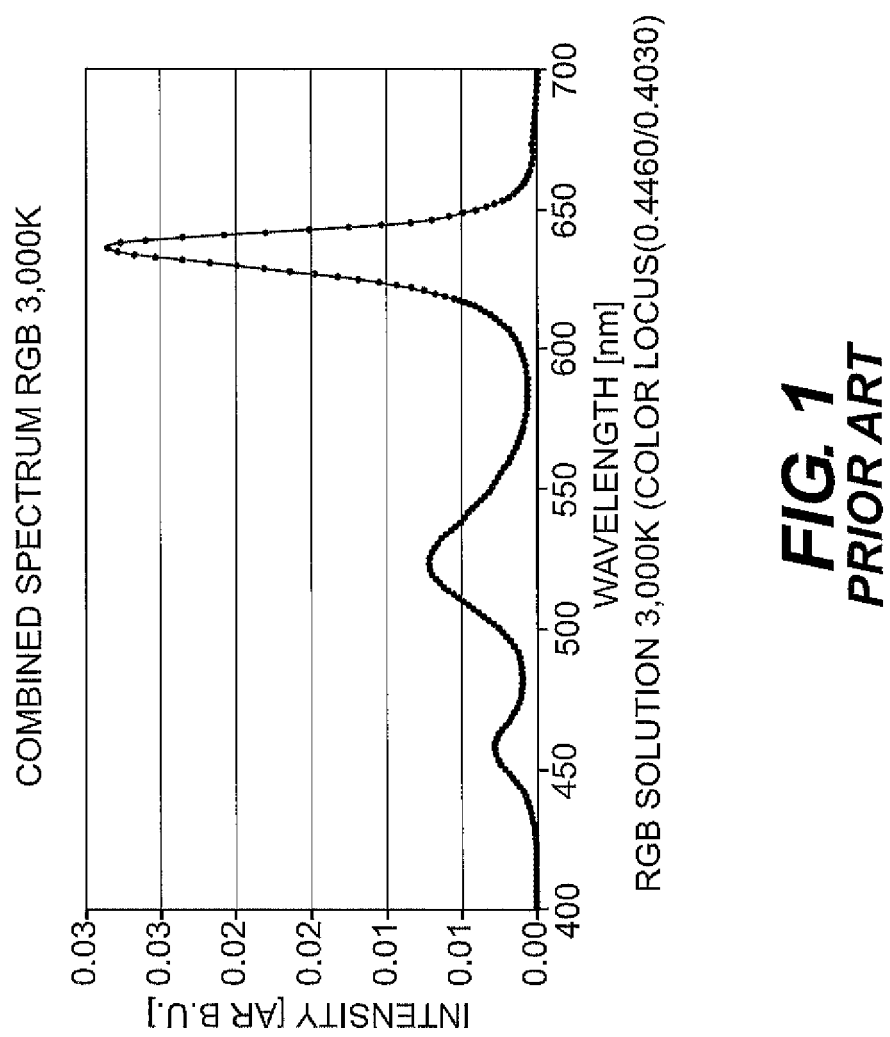
FIG. 1 is a graph of a spectrum RGB solution 3000K according to the prior art.
Figure 2:
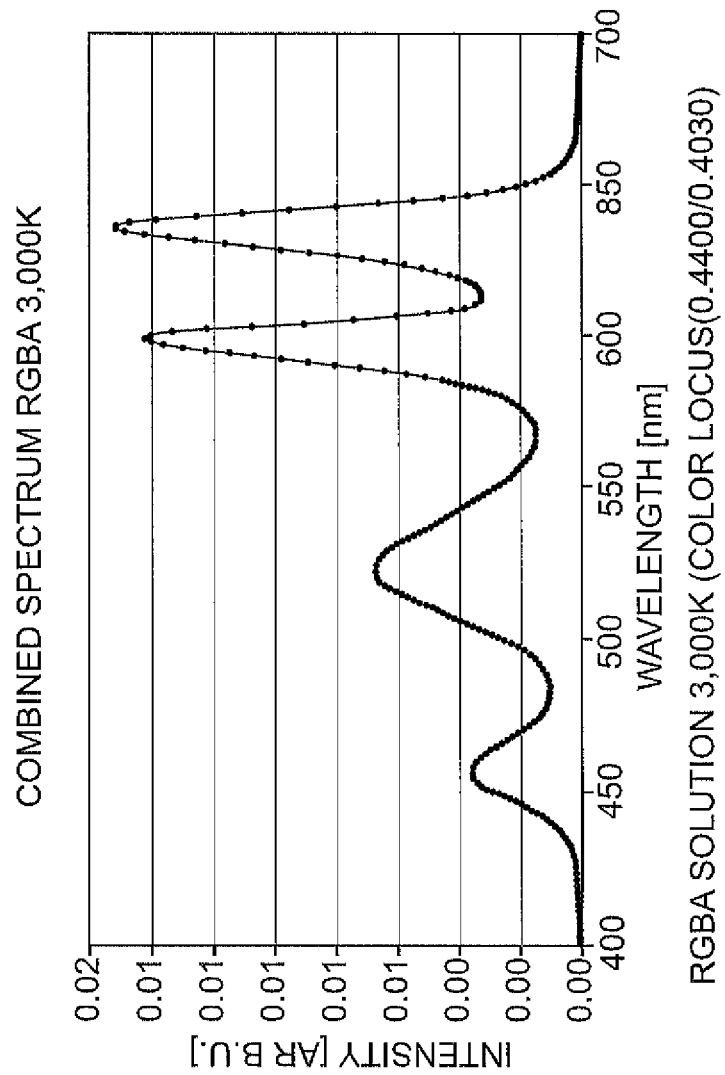
FIG. 2 is a graph of a spectrum RGBA solution 3000K according to the prior art.
Figure 3:
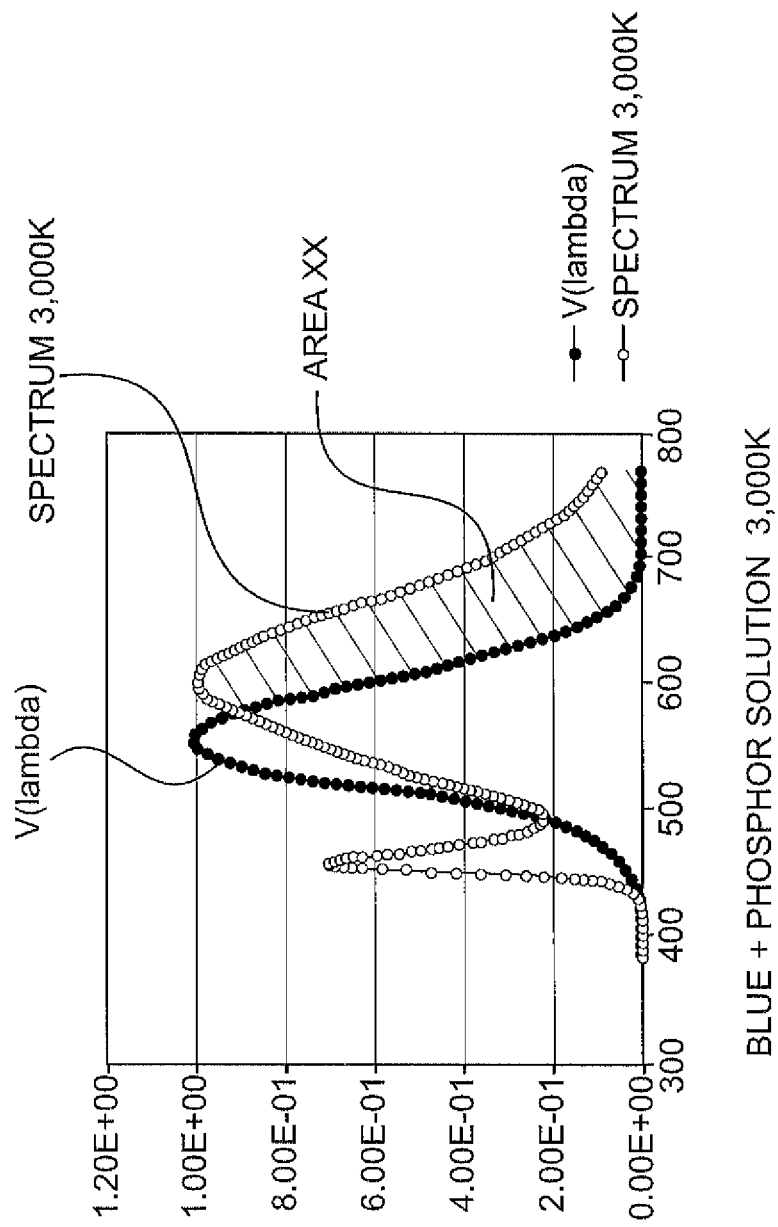
FIG. 3 is a graph of a spectrum phosphor solution 3000K and V(lambda) of the prior art.

This optimal energy balance according to embodiments of the invention is produced through the utilization of the highest efficiency of the phosphors (Group P) combined with the reduction of the xx area on the descending curve branch of the V(lambda) curve (utilization of Group R). The shaded area shows the xx area in FIG. 10 greatly minimized compared to the prior art (FIG. 3). This minimized xx area in FIG. 10 exemplifies an advantage of the present invention compared to the prior art.

The solutions according to the prior art attempt to hit Planck's curve precisely by means of color conversion (phosphors). As described herein, a purpose of this invention is to deliberately deviate from this path and use, by way of example, the maximum efficiency of the phosphor (Group P) in connection with the low half-width of the LEDs of Groups B and R. A low half width is advantageous in the ranges of lower weighting through the V(lambda) curve.

Figure 11:
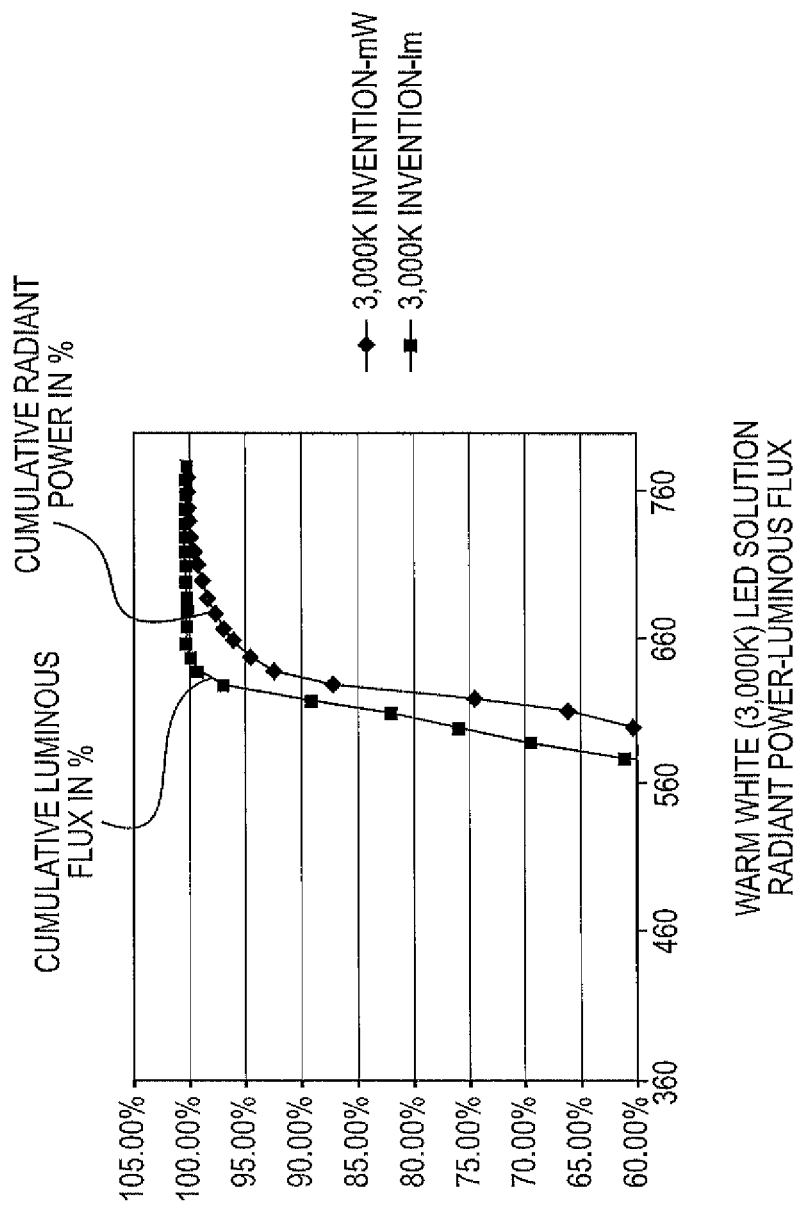
FIG. 11 is a graphical comparison of the cumulative radiant power with the cumulative luminous flux of the test lamp according to FIG. 9.

Corresponding measured values of a test sample are shown in Table 6 and in FIG. 11. White light is produced through the mixture of LEDs of Group R with LEDs of Group P. The spectrum thus produced is shown in FIG. 10.

TABLE 6

10 nm steps - cumulative radiometric energy (radiant power) in % and associated cumulative lumen in %

| min. | max. | 3000 K Erfindung-mW | 3000 K Erfindung-lm |
|---|---|---|---|
| 380 | 389 | 0.01% | 0.00% |
| 390 | 399 | 0.02% | 0.00% |
| 400 | 409 | 0.03% | 0.00% |
| 410 | 419 | 0.06% | 0.00% |
| 420 | 429 | 0.13% | 0.00% |
| 430 | 439 | 0.50% | 0.01% |
| 440 | 449 | 2.14% | 0.11% |
| 450 | 459 | 5.94% | 0.45% |
| 460 | 469 | 9.27% | 0.90% |
| 470 | 479 | 11.51% | 1.36% |
| 480 | 489 | 12.92% | 1.80% |
| 490 | 499 | 14.05% | 2.34% |
| 500 | 509 | 15.50% | 3.44% |
| 510 | 519 | 17.82% | 6.03% |
| 520 | 529 | 21.28% | 11.04% |
| 530 | 539 | 25.89% | 18.75% |
| 540 | 549 | 31.40% | 28.67% |
| 550 | 559 | 37.43% | 39.80% |
| 560 | 569 | 43.57% | 50.89% |
| 570 | 579 | 49.47% | 60.88% |
| 580 | 589 | 54.98% | 69.24% |
| 590 | 599 | 60.18% | 75.98% |
| 600 | 609 | 65.86% | 81.98% |
| 610 | 619 | 74.59% | 89.12% |
| 620 | 629 | 87.24% | 96.87% |
| 630 | 639 | 92.27% | 99.04% |
| 640 | 649 | 94.40% | 99.62% |
| 650 | 659 | 95.80% | 99.85% |
| 660 | 669 | 96.84% | 99.94% |
| 670 | 679 | 97.63% | 99.98% |
| 680 | 689 | 98.24% | 99.99% |
| 690 | 699 | 98.70% | 100.00% |
| 700 | 709 | 99.05% | 100.00% |
| 710 | 719 | 99.31% | 100.00% |
| 720 | 729 | 99.51% | 100.00% |
| 730 | 739 | 99.67% | 100.00% |
| 740 | 749 | 99.78% | 100.00% |
| 750 | 759 | 99.87% | 100.00% |
| 760 | 769 | 99.94% | 100.00% |
| 770 | 779 | 100.00% | 100.00% |

FIG. 11 gives a graphic representation of this correlation. The abscissa of FIG. 11 represents the wavelength in nm, the ordinate represents the cumulative radiant power or the cumulative luminous flux in percentage. 92% of the radiant power produces 99% of the luminous flux. 8% of the radiometric energy (from 650 nm) produces 1% of the luminous flux (see FIG. 11).

An embodiment according to the invention makes it possible for an LED module, an LED lighting means, or an LED lamp to have excellent efficiency as well as a very good color rendition. Compared to a solution based purely on phosphor, the efficiency (with comparable color value rendition) is improved by at least 20%. In a realized example that was constructed and tested, an energy saving of 25% was achieved.

Figure 12:
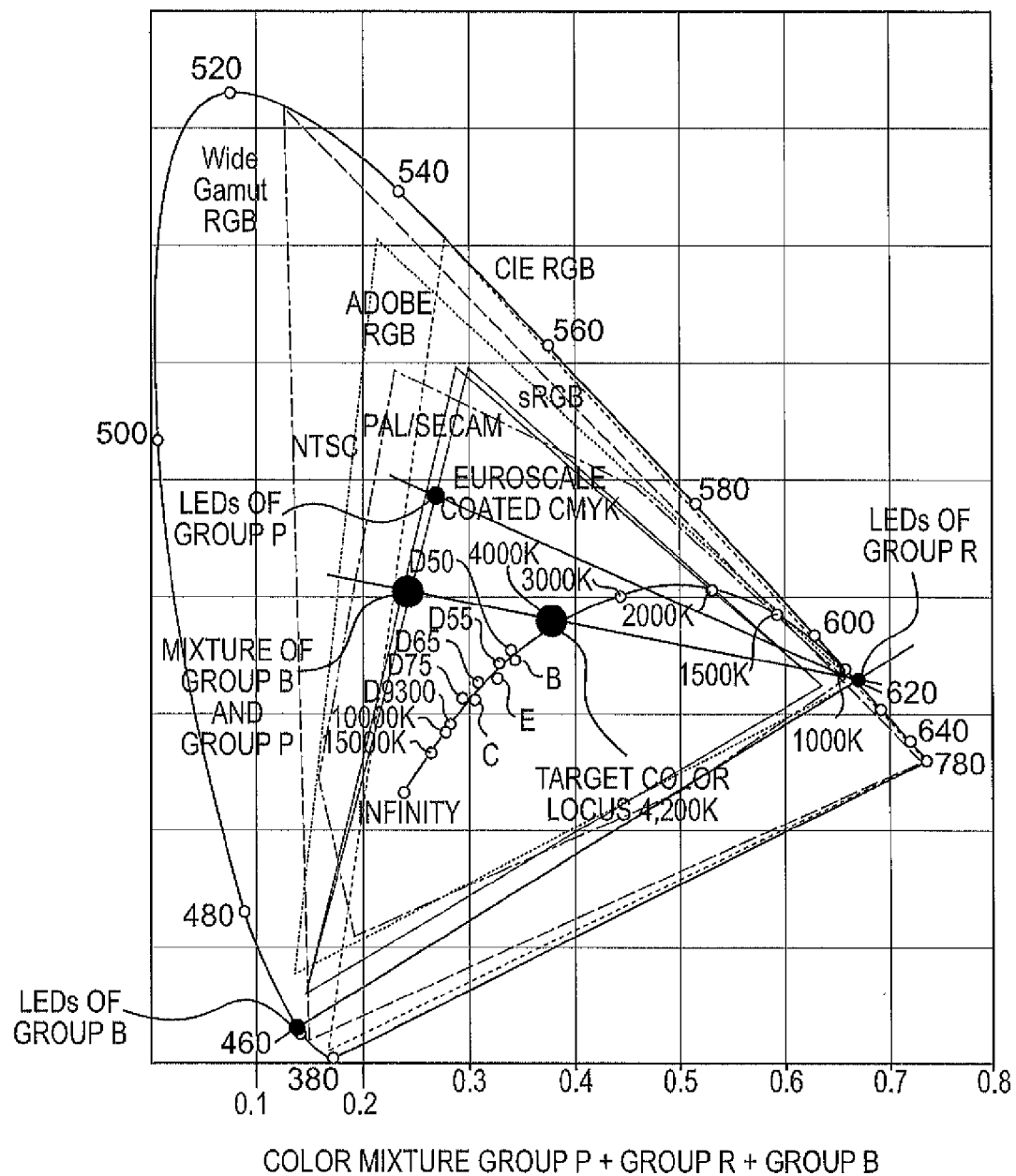
FIG. 12 is an example of a color mixture of LEDs of Group P, of LEDs of Group B, and of LEDs of Group R in the CIE 1931 color space.

Another significant advantage of this solution is that the color temperature can be regulated or controlled in a stepless manner very easily through the addition of LEDs of Group B (blue LEDs). A color space is thus generated that lies between the corner points of the respective groups (Group B, Group P, Group R) and thus all of the colors within this color space can be imaged. FIG. 12 shows the color space generated by the 3 groups.

In particular white light can thus be produced very efficiently and with high color rendition along Planck's curve. Corresponding measured values of a test sample show that the color temperature can be controlled or regulated between 2500 and 8000K and the Ra8 color rendition is approximately 90 over the entire color temperature range.

Figure 13:
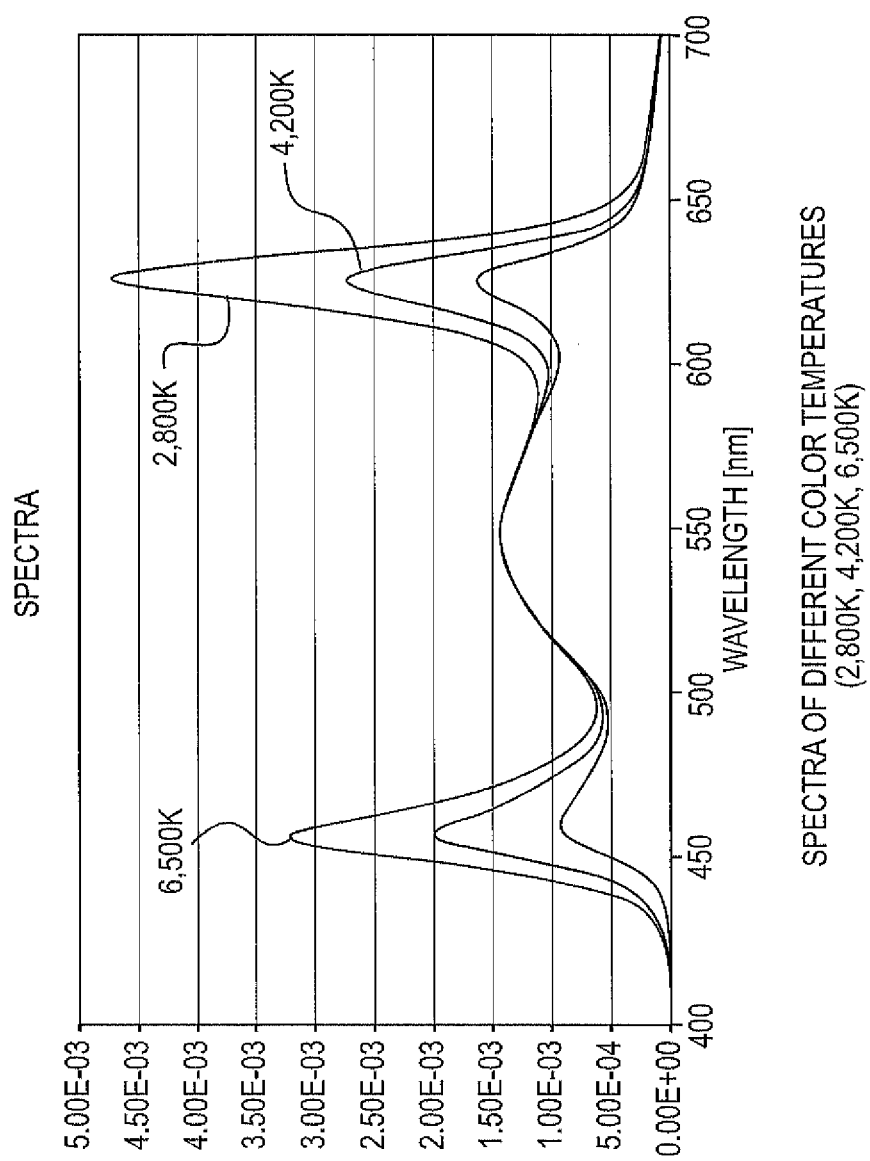
FIG. 13 is graphical example of an LED module according to the example from FIG. 12, showing that the power of the LEDs of Group B and the LEDs of Group R can be regulated and controlled, all three spectra shown being realizable with one module.

The adjustment of a color temperature, for example, 4200K, is carried out in that starting from the color locus of Group P the intensity of Group B is increased until the desired mixed color locus is produced on the straight line between the points of Group P and Group B. The intensity of Group R must be increased until the target color locus (for example, 4200K) is achieved on Planck's curve. FIG. 12 shows the mixture of the 3 groups at target color locus 4200K. FIG. 13 shows the spectra of the color loci 2800K, 4200K and 6500K.

An embodiment of the LED module according to the invention is an LED module on a COB (chip on board) basis.

Another embodiment of the invention is an LED module characterized in that the LEDs of Group P and the LEDs of Group R are arranged under a common color conversion layer.

In a further embodiment, the LED module according to the invention is based on SMD LED components.

Figure 4:
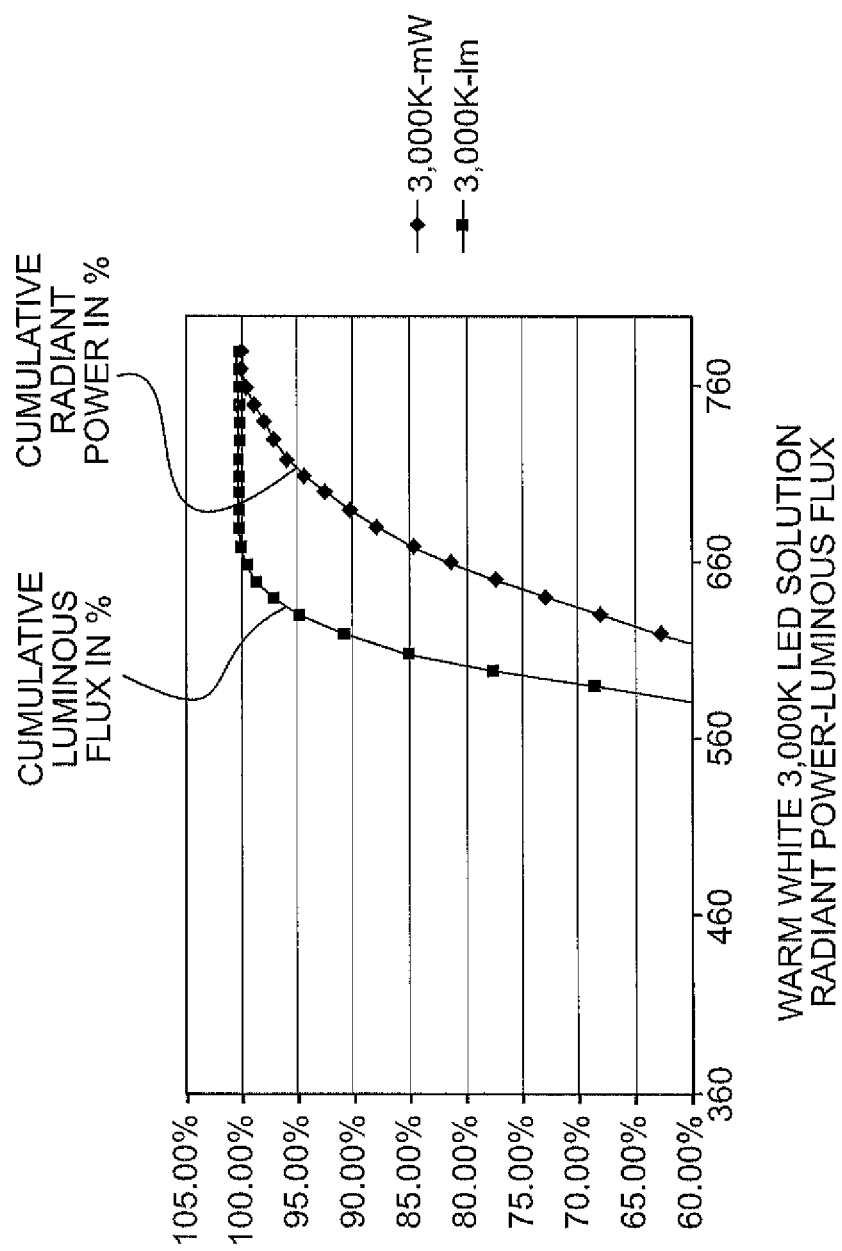
FIG. 4 is a graph of a comparison of the cumulative radiant power to the cumulative luminous flux of the prior art.
Figure 14:
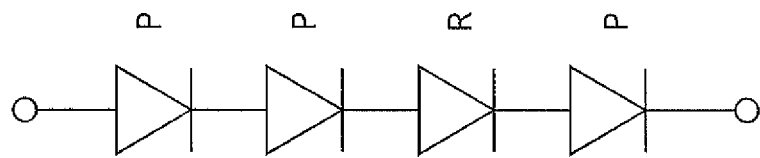
FIG. 14 is a circuit diagram for four LEDs in series.

FIG. 14 shows as a first exemplary embodiment a series connection of several LEDs to achieve the color locus. Three LEDs of Group P with an LED of Group R are embodied as an LED module. The number of LEDs selected depends on the output of the individual LEDs. The number of LEDs and their ratio to one another should therefore not be understood to be restricting. Although the ratio shown in FIG. 4 is 3:1, the ratio could be 2:1 or 4:2 or the like.

Figure 15:
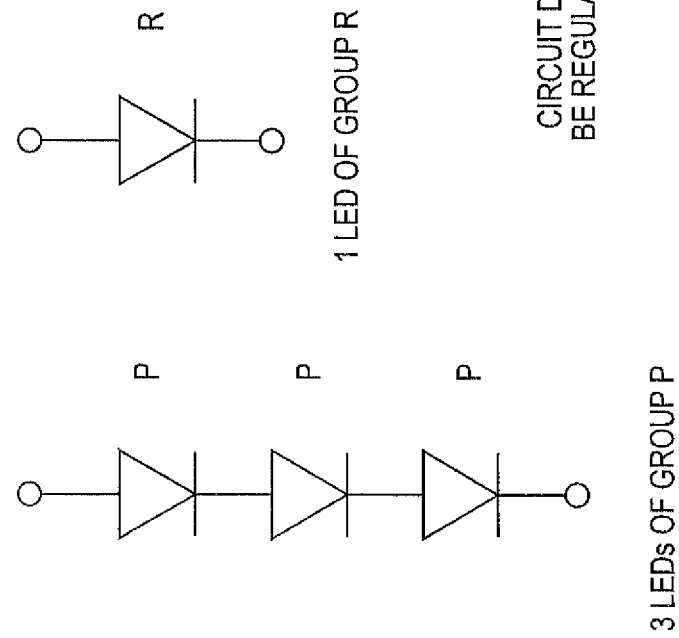
FIG. 15 is a circuit diagram for four LEDs, two groups that can be controlled and regulated separately.

FIG. 15 shows as a modified exemplary embodiment that the LEDs of Group P can be controlled separately from the LEDs of Group R. A more precise regulation is thus possible. The Planck's curve for the respective color locus can thus be hit even more precisely.

Figure 16:
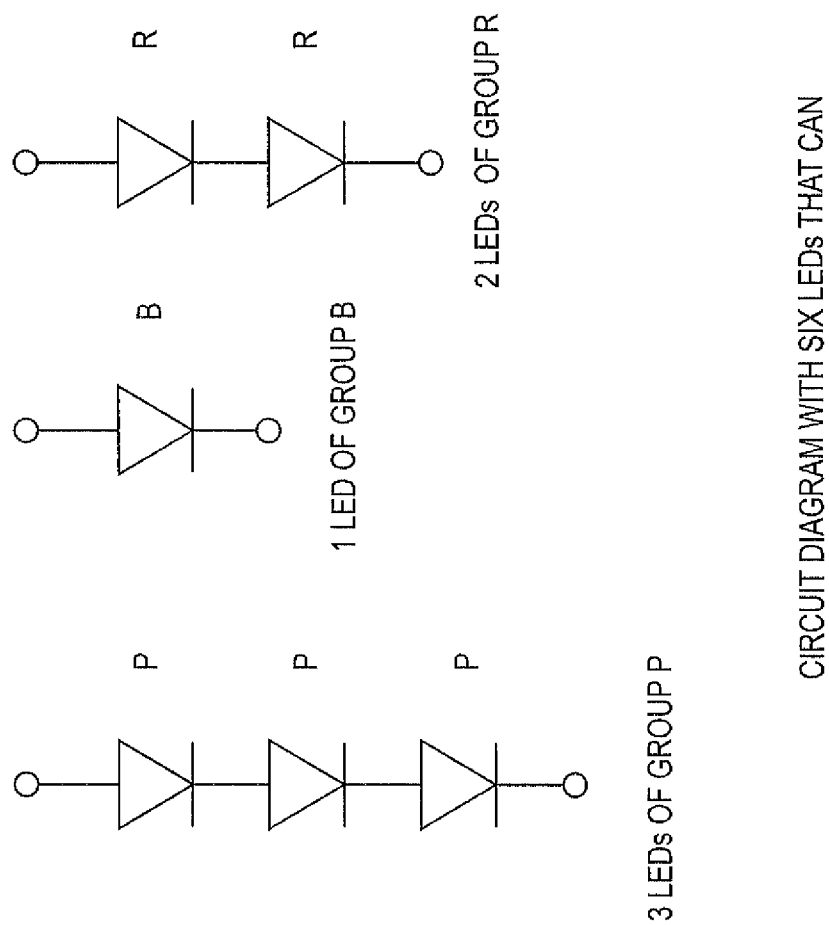
FIG. 16 is a circuit diagram for six LEDs, three groups that can be controlled and regulated separately.

FIG. 16 shows a circuit diagram with six LEDs, which again can be controlled separately. In addition to the LEDs of Group P and Group R, LEDs of Group B can be used. With this embodiment the color temperature can be adjusted in the range from 2500K to 8000K.

Figure 17:
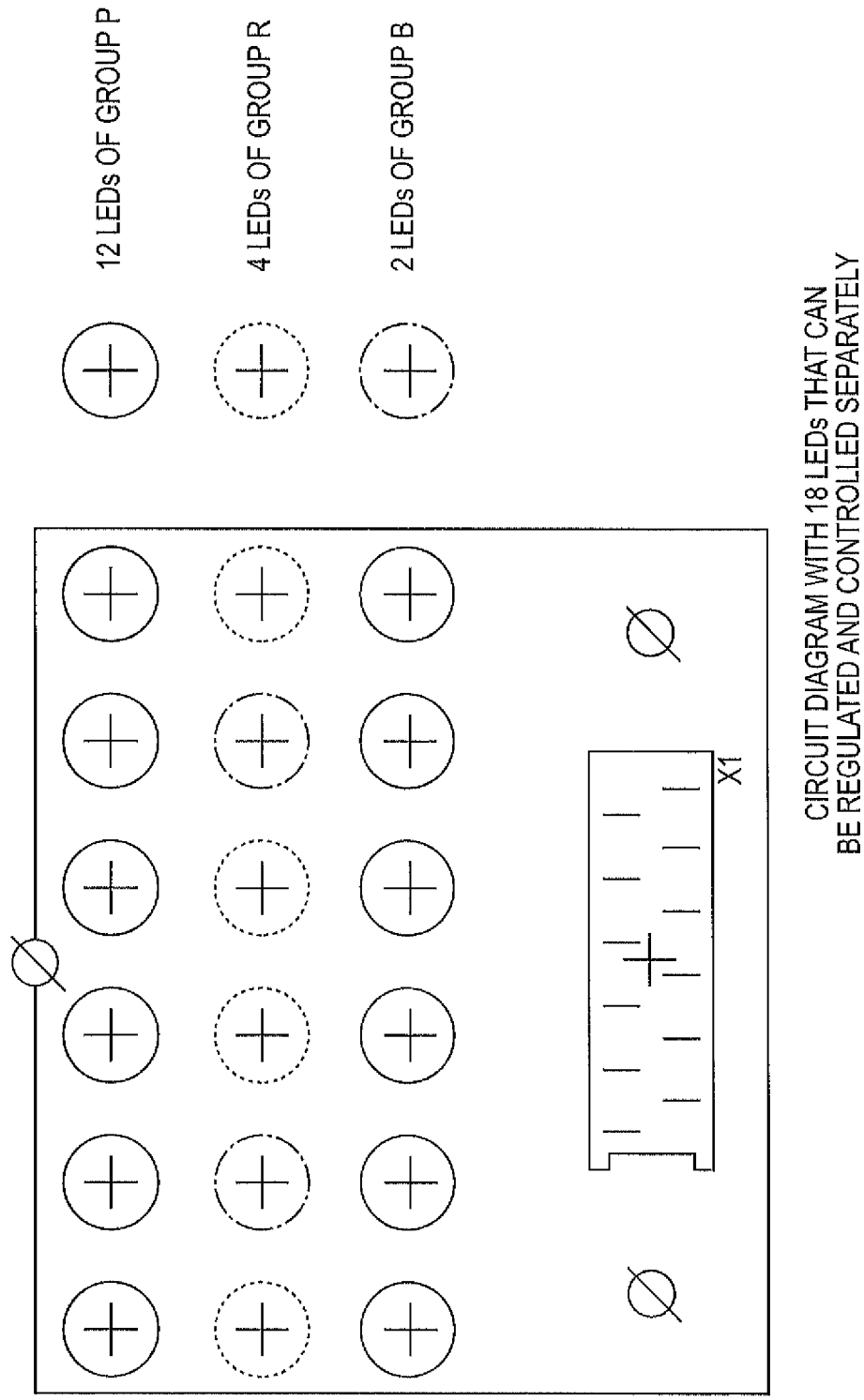
FIG. 17 is a representation of an LED module with 18 LEDs, with three groups that can be controlled and regulated separately.

FIG. 17 shows a COB LED module with 18 LEDs including a connector. The color temperature can be controlled or regulated between 2500K-8000K. The module shown currently has an efficiency of 60 lm/W over the entire controlling range and an Ra8 value of over 90.

Figure 18:
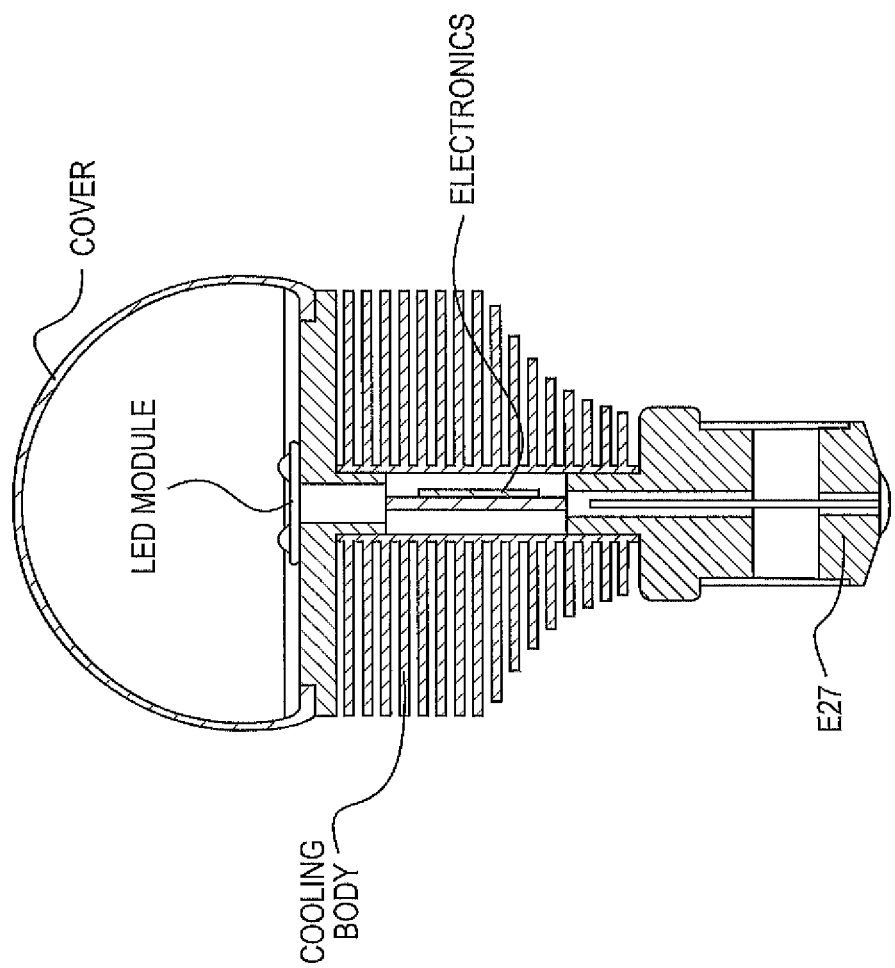
FIG. 18 is a representation of an LED lighting means with an E27 standard socket.

FIG. 18 shows an LED module according to an embodiment of the invention, together with the associated electronics, installed in a housing, wherein the electrical connection and the form and the dimensions are selected such that a normalized standard lighting means can be used. Particular examples are normalized incandescent lamps, normalized halogen lamps, or normalized fluorescent lamps, and compact fluorescent lamps. Normalized lamps of this type can be defined in particular according to one of the standards E** (in particular E27), G*, GU*, M*, B*, or T*. The LED module according to an embodiment of the invention installed in standard lighting means can thus successfully replace an incandescent lamp, among others, according to one of these standards.

An LED lighting means according to FIG. 18 currently has an exemplary power consumption from 8 to 10 watts of electric power and a luminous efficiency in the range of 500 and 600 lumens. That means that the 10 watts consumed here correspond, in terms of the luminous efficiency, to approximately that of a 60 watt incandescent lamp. With the variant described in FIG. 18, approximately 80% of the energy is saved.

Figure 19:
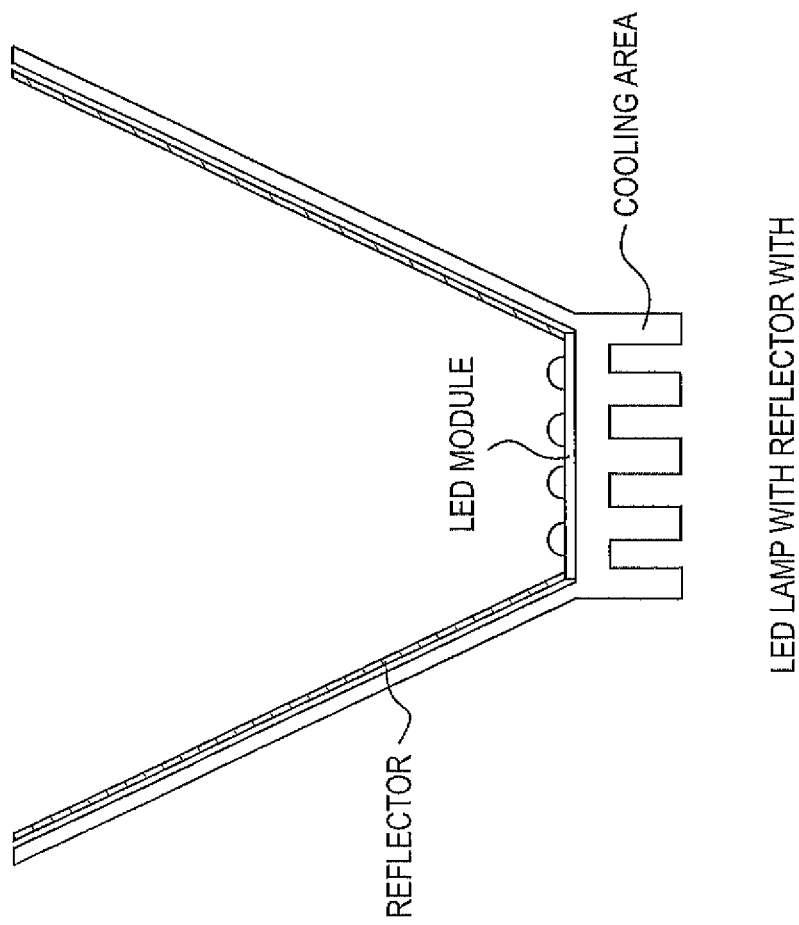
FIG. 19 is a representation of an LED lamp with a reflector, in which one or more LED modules can be used.

In FIG. 19 an LED lighting means is equipped with one or more of the LED modules previously described.

The cover serves as a dust protection and/or as a diffuser. The cooling body has cooling fins, which guarantee a favorable heat dissipation.

FIG. 19 shows an LED module according to an embodiment of the invention installed in a lamp. There the LED module is installed in a reflector on the base area of which cooling bodies are arranged. Through the angle of the reflector the radiation characteristics are concentrated in a center area. This is an example to show that the LED module can also be installed in a lamp and can be used other than as a lighting means.

Figure 20:
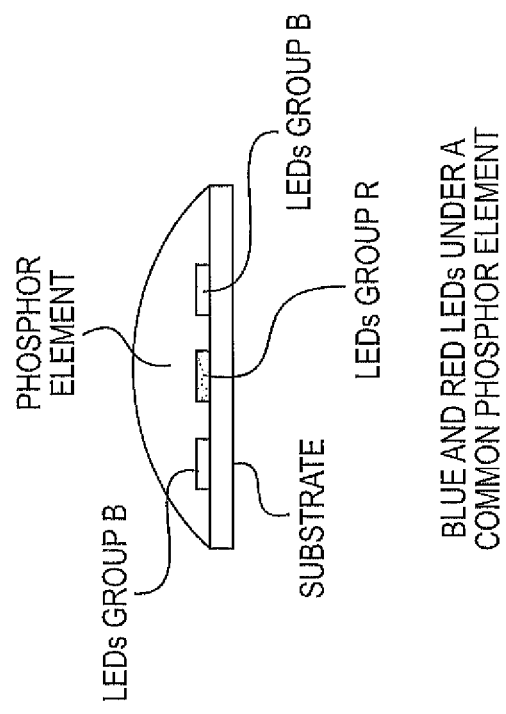
FIG. 20 is a diagrammatic representation of an LED module with LEDs of Group B and LEDs of Group R under a common phosphor element.

FIG. 20 shows diagrammatically an LED module with LEDs of Group B and LEDs of Group R under a common phosphor element. This embodiment is particularly advantageous with respect to the mixture of the spectral portions, and the use of a diffuser element can be omitted. The integrated lighting means shown here combines LEDs of Group P and LEDs of Group R in the smallest space on a common substrate. They are contacted on the substrate in an electrically conductive manner.

The LEDs of Group B excite the phosphor to radiate, which emits its conversion radiation outwardly. Because the radiation of the LEDs of Group R is not affected by the phosphor, on the surface of the covering phosphor element the desired white light impression of the additive mixture of radiation of Group P and Group R is produced.

In conclusion, features of embodiments of the invention are presented in the form of a brief list:

LED module with optimal energy balance—efficiency.
LED module with Ra8≥85, typically 90-95.
LED module constructed in COB technology or SMD technology.
LEDs of different groups under one phosphor element.
LED module according to an embodiment of the invention for LED lighting means with standard socket (for example, E27).
Lamps with LED modules according to embodiments of the invention with a reflector.
Lamps with LED modules according to embodiments of the invention with lenses.
LED modules with color temperature that can be controlled and regulated.

The LED module according to embodiments of the invention produces white light of a high quality (Ra8>85) very efficiently. This LED module can therefore preferably be used for applications in general lighting, shop lighting, office lighting, museum lighting, medical technology, industrial lighting, among others.

The color temperature that can be controlled and regulated permits a stepless change of the S/P ratio (scotopic/photopic). This LED module can thus advantageously be used in street lighting. The needs of the human eye during twilight vision (mesopic) are taken into account through the stepless alteration of the color temperature.

TABLE 7

S/P ratio of the samples according to FIG. 13

| Color temperature | S/P ratio |
|---|---|
| 2800 K | 1.4 |
| 4200 K | 1.8 |
| 6500 K | 2.3 |

What is claimed is:

1. An LED module comprising:
   at least one LED of a Group B of LEDs wherein the Group B of LEDs comprises one or more LEDs with a dominant wavelength in a value range of 380 nm to 480 nm;
   at least one LED of a Group R of LEDs, wherein the Group R of LEDs comprises one or more LEDs with a dominant wavelength in a value range of 600 nm to 640 nm;
   at least one LED of a Group P of LEDs which comprises one or more LEDs that excite a phosphor or a phosphor mixture and are from the Group B of LEDs wherein emissions of the at least one LED of the Group P and of the at least one LED of the Group R and of the at least one LED of the Group B are additively mixed;
   a concentration of the phosphor or of the phosphor mixture of the at least one LED of the Group P being selected such that a photometric efficacy thereof, measured in lm/W, as a function of a CIE x-coordinate lies at a maximum or not more than about 20% below the maximum;
   the at least one LED of the Group P and the at least one LED of the Group R and the at least one LED of the Group B are formed and can be activated and controlled or regulated in such a way that white light is generated, and a color locus of the white light lies on or near Planck's curve, wherein a color temperature of the white light can be adjusted steplessly in a range of 2800K to at least 6500K and that a color rendition Ra8 of the white light amounts to at least 85.

2. The LED module according to claim 1, wherein the LED module can be controlled or regulated such that the color temperature of the white light that is generated can be adjusted steplessly in a range of 2500K to 8000K.

3. The LED module according to claim 2, wherein the color temperature between 2500K and 8000K can be steplessly controlled or regulated from LEDs of Group P and Group G and Group B to produce white light, the color locus lies on or near Planck's curve and the phosphor of Group P has a peak wavelength in the value range between 590 and 640 nm.

4. The LED module according to claim 2, wherein LEDs of the Group B and LEDs of the Group R are arranged under a common color conversion layer.

5. The LED module according to claim 2, wherein the LED module is installed in a standard lighting means.

6. The LED module according to claim 2, wherein with a power consumption of 8 to 10 watts electric power, a luminous efficiency of at least 500 lumens is achieved and at the same time the Ra8 value is greater than 85.

7. The LED module according to claim 1, wherein the color temperature between 2500K and 8000K can be steplessly controlled or regulated from LEDs of Group P and Group G and Group B to produce white light, the color locus lies on or near Planck's curve and the phosphor of Group P has a peak wavelength in the value range between 590 and 640 nm.

8. The LED module according to claim 1, wherein LEDs of the Group B and LEDs of the Group R are arranged under a common color conversion layer.

9. The LED module according to claim 8, wherein the LED module is installed in a standard lighting means.

10. The LED module according to claim 1, wherein the LED module is installed in a standard lighting means.

11. The LED module according to claim 1, wherein with a power consumption of 8 to 10 watts electric power, a luminous efficiency of at least 500 lumens is achieved and at the same time the Ra8 value is greater than 85.

12. The LED module according to claim 1, wherein the color temperature of the white light that is generated can be adjusted steplessly within at least a partial range of Plancks curve that is located within a color space spanned by color loci of the LEDs of the Group P, the Group R, and the Group B.

13. The LED module according to claim 12, wherein LEDs of the Group B and LEDs of the Group R are arranged under a common color conversion layer.

14. The LED module according to claim 12, wherein the LED module is installed in a standard lighting means.

15. A method for producing an LED module, wherein the adjustment of a color temperature is carried out starting from the color locus of Group P, the intensity of Group B is increased until the desired mixed color locus is produced on the straight line between the points of Group P and Group B and then the intensity of Group R is increased until the target color locus is achieved on Planck's curve.

* * * * *